United States Patent [19]

Whatmore et al.

[11] Patent Number: 4,523,119
[45] Date of Patent: Jun. 11, 1985

[54] APPLICATION OF LITHIUM TETRABORATE TO SAW DEVICES

[75] Inventors: Roger W. Whatmore, Bletchley; Iain M. Young, Malvern, both of England

[73] Assignee: Plessey Overseas Limited, Ilford, England

[21] Appl. No.: 625,590

[22] Filed: Jun. 29, 1984

Related U.S. Application Data

[63] Continuation of Ser. No. 271,112, Jun. 8, 1981, abandoned.

[30] Foreign Application Priority Data

Jun. 11, 1980 [GB] United Kingdom ............... 8019062
Dec. 23, 1980 [GB] United Kingdom ............... 8041183

[51] Int. Cl.³ .......................................... H01L 41/08
[52] U.S. Cl. ............................................. 310/313 A
[58] Field of Search ............... 310/311, 357, 358, 359, 310/313 A, 360, 361, 334–337; 252/62.9

[56] References Cited

PUBLICATIONS

Lithium Tetraborate: A New Temperature Compensated Saw Substrate Material, by Whatmore et al., Electronics Letters (G.B.), vol. 17, No. 1, pp. 11–12, Jan. 8, 1981.

Primary Examiner—Mark O. Budd
Attorney, Agent, or Firm—Fleit, Jacobson, Cohn & Price

[57] ABSTRACT

An electronic device, such as a Surface Wave, Bulk Wave or pyroelectric device, exploiting the polar nature of an active material in which the active material is lithium tetraborate or a closely related compound for example one which is slightly deficient in Lithium or Boron e.g. $Li_2 \mp$, $S_1B_4O_7$ or $Li_2B_4 \mp S_2O_7$ where $S_1$ and $S_2$ are small numbers.

1 Claim, 8 Drawing Figures

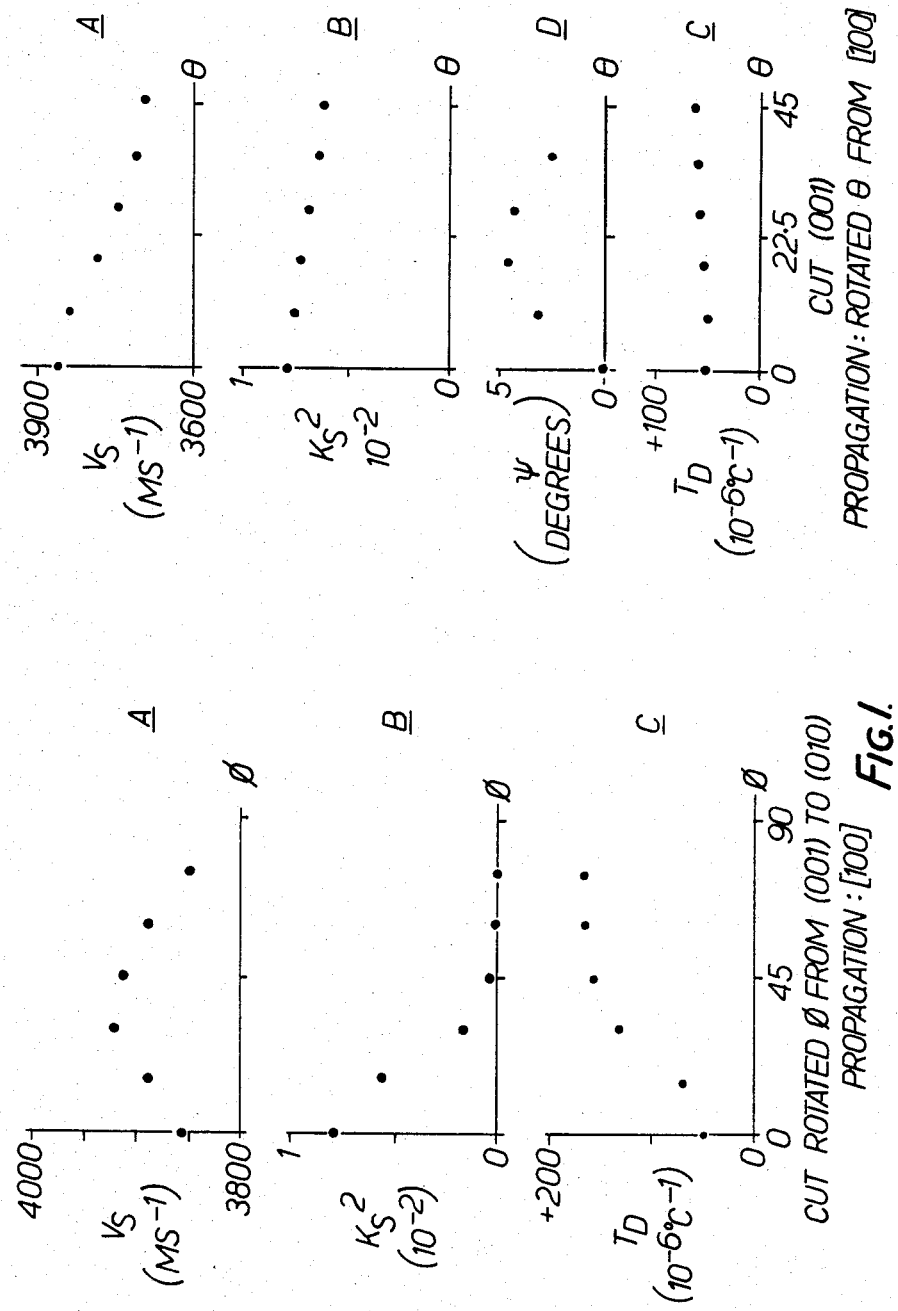

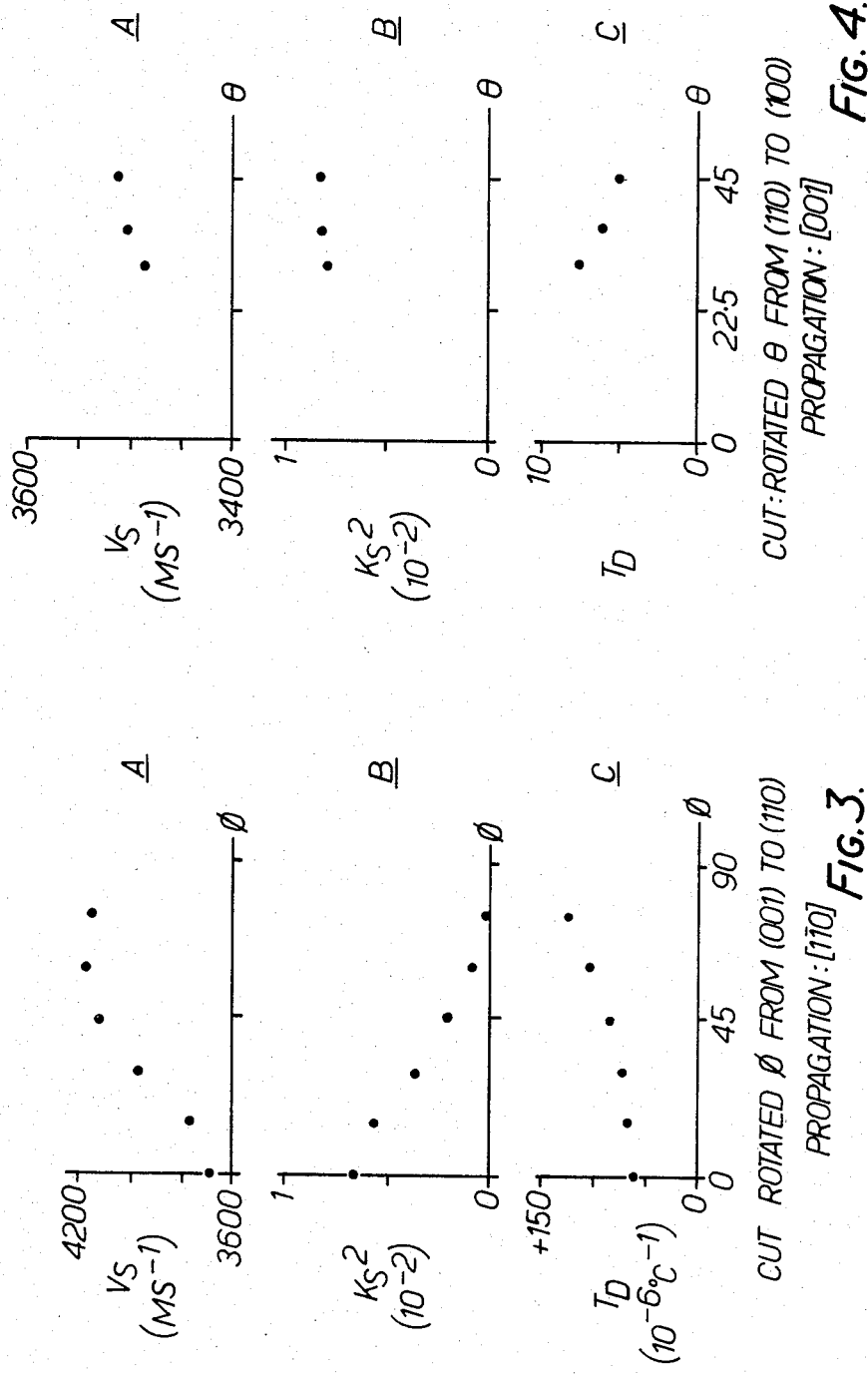

APPLICATION OF LITHIUM TETRABORATE TO SAW DEVICES

This application is a continuation of application Ser. No. 271,112, filed June 8, 1981, now abandoned.

The present invention relates to the application of lithium tetraborate to electronic devices and in particular to surface acoustic wave, bulk wave resonant surface skimming bulk wave and pyroelectric detection devices. It also relates to devices used for the generation and detection of bulk waves in solids and liquids and devices for generation and detection of static displacements. Such devices are defined for the purpose of this invention as Electronic devices exploiting the polar nature of a material.

A surface acoustic wave device is defined for the purpose of the present invention as an electronic device which uses a piezoelectrically generated Rayleigh wave. Such devices include, Band Pass Filters, Delay Lines, Tapped Delay Lines, Reflective Array Pulse Compression Filters, Chirped transducer filters and Parametric Devices including Convolvers.

A Bulk Wave or Piezoelectric device is defined for the purpose of the present invention as an electronic device employing waves propagating in the bulk of the crystal material. Such devices include Band Pass Filters Transducers for non destructive testing. Sonar devices Hydrophones, and Bulk Wave piezoelectric delay lines.

A pyroelectric device is defined for the purpose of the present invention as a device which uses pyroelectrically generated charge for sensing changes in temperature. Such devices include Pyroelectric Thermal Imagers in which the pyroelectric target is scanned by a beam of charged particles, Single and Multielement detector arrays for use in equipment such as intruder alarms.

A suitable material for piezoelectric surface acoustic wave, bulk wave resonant and bulk wave transducer devices should possess defined electromechanical coupling and temperature compensation properties.

It is an object of the present invention to provide surface acoustic wave and bulk wave devices with good electrical and mechanical properties by the choice of material.

The present invention provides an Electronic Device exploiting the polar nature of an active material in which the active material is lithium tetraborate. Lithium tetraborate is herein defined to also include closely related compounds which for example, contain slight deficiencies or excess of lithium or Boron e.g. $Li_{2\mp\delta_1}B_4O_7$ or $Li_2B_{4\mp\delta_2}O_7$ where $\delta_1$ and $\delta_2$ are small numbers.

Lithium Tetraborate possesses the point symmetry 4 mm. The Z axis is conventionally defined as being parallel to the 4-fold symmetry axis. The X axis is defined as being perpendicular to the Z axis and parallel to the crystallographic [100] direction. The Y axis is mutually perpendicular to the X and Z axes.

An X cut Z propagating crystal or one that is close to X cut and Z propagating is particularly suited to Surface Acoustic Wave Devices, a Z cut crystal orientation is particularly suited to Bulk wave devices, an X cut Y propogating crystal is particularly suited to Surface Skimming Bulk Wave devices and an X cut crystal is particularly suited to pyroelectric devices.

The choice of the material is however not the only factor in determining the characteristics of a surface wave or bulk wave device. The identification and selection of the crystal cut is a determining factor in the property of the device. By the choice of an appropriate angle of cut the characteristics of the material can be made to suit the particular required device. Appropriate cuts for the lithium tetraborate will be described hereinafter for various devices.

Lithium tetraborate, $Li_2B_4O_7$ has been found to be a material which shows anomalous elastic constant temperature behaviour (i.e. certain coefficients of the elastic stiffness tensor increase with increasing temperature) which has been demonstrated by measurement using ultrasonic pulse-echo and piezoelectric resonance techniques. This means that the material may possess crystal cuts for piezoelectric bulk wave and SAW (surface acoustic wave) devices which show zero temperature coefficients of frequency. The piezoelectric coupling factors for the material are moderate (for a Z-plate $K_T \approx 0.4$) which means that the bulk-wave and SAW coupling factors will be larger than those in quartz. The combination of the presence of temperature-compensated cuts with good piezoelectric coupling gives the material several advantages over the two materials most commonly used for SAW and bulk-wave devices: $LiNbO_3$ and $\alpha$-quartz (the former possesses good electromechanical coupling but shows no temperature compensation, while the latter shows temperature compensation but possesses only poor electromechanical coupling factors). These advantages include the ability to make wider bandwidth devices, showing smaller insertion losses than similar devices on $\alpha$-quartz, while maintaining good frequency temperature stability.

Embodiments of the present invention will now be described by way of example with reference to the accompanying drawings in which:

FIGS. 1 to 5 show for various crystal cuts as specified in graphs A, B and C respectively the variations of surface acoustic wave (S.A.W.)velocity Vs: SAW coupling factor $k_s^2$ (defined conventionally as $k_s^2 \approx 2\delta V/Vs$ where $\delta V$ is the change in velocity of the surface wave which occurs as it passes under a conducting plane on the substrate surface) and $T_D$ the first order temperature coefficient of SAW delay with the change in the substrate orientation and SAW propagation direction. FIG. 2 also shows in graph D the variation in SAW power-flow angle.

Figure 5:
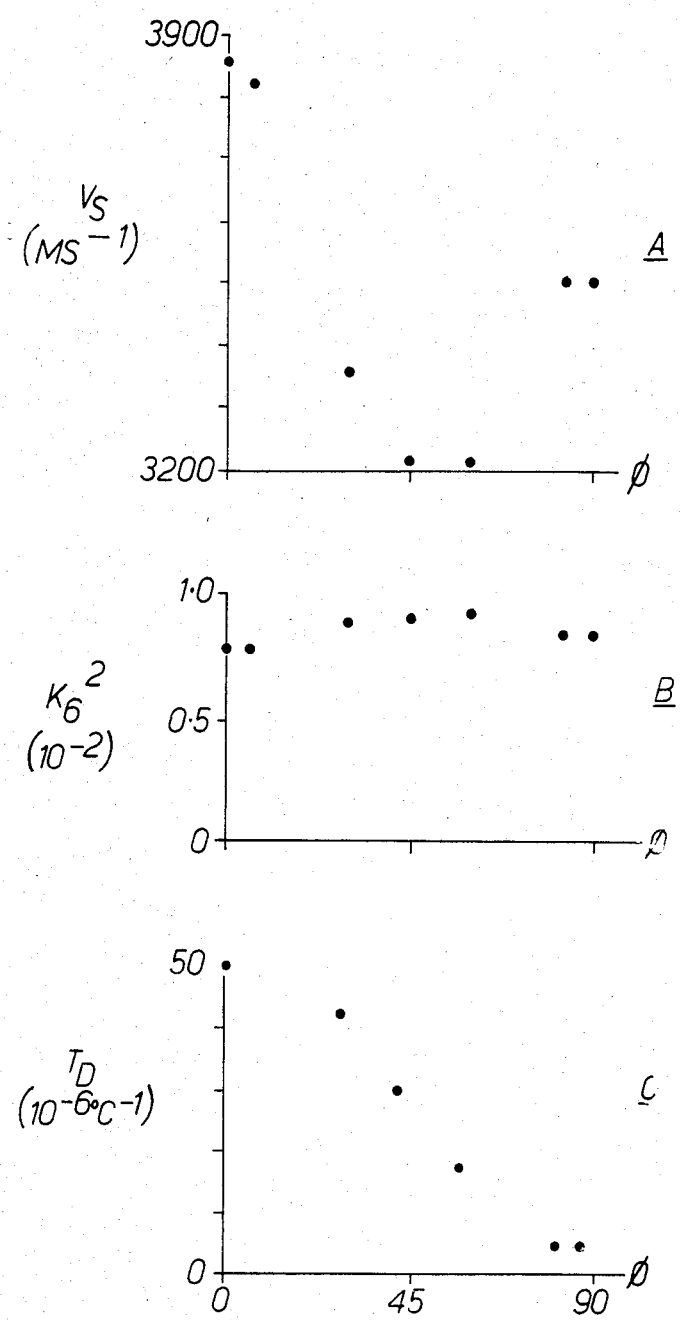

Initial measurements of the piezoelectric and elastic properties of $Li_2B_4O_7$ have indicated its promise as a piezoelectric surface acoustic wave (SAW) substrate and bulk wave (BW) resonator material. Table 1 shows the values of the electric constant, dielectric constant and piezoelectric coefficient tensor moduli at a temperature of 20° C. Also listed in this table are the first order temperature coefficients of these moduli and the estimated standard errors in the various quantities.

TABLE 1

THE PIEZOELECTRIC, AND DIELECTRIC CONSTANT TENSOR COEFFICIENTS OF $Li_2B_4O_7$.

| Co-efficient | Value at 20° C. | Estimated Error | Units | First-Order Temperature Coefficient ($10^{-6}$ °C.$^{-1}$) |
|---|---|---|---|---|
| $c_{11}^E$ | 12.71 | 0.11 | $10^{10}$ Nm$^{-2}$ | −51 |
| $c_{12}^E$ | 0.6 | 0.20 | " | +1600 |
| $c_{13}^E$ | 2.94 | 0.15 | " | +390 |
| $c_{33}^E$ | 5.38 | 0.83 | " | −21 |
| $c_{44}^E$ | 5.38 | 0.04 | " | −22 |
| $c_{66}^E$ | 5.74 | 0.05 | " | −200 |
| $e_{15}$ | 0.278 | 0.005 | Cm$^{-2}$ | −349 |
| $e_{31}$ | 0.10 | 0.04 | " | −2300 |
| $e_{33}$ | 0.77 | 0.04 | " | +385 |
| $\epsilon_{11}^s$ | 0.80 | 0.01 | $10^{-10}$ Fm$^{-1}$ | −92 |
| $\epsilon_{33}^s$ | 0.78 | 0.01 | " | +120 |

$c_{ij}^E$'s are elastic constant stiffness coefficients at constant electric field
$e_{ij}$'s are piezoelectric coefficients
$\epsilon_{ij}^s$'s are crystal permittivities at constant strain As stated a principal use of the material will be for SAW applications. The properties suitable for such applications as illustrated in FIGS. 1 to 6 and FIG. 8.

FIGS. 1 to 5 show the computed variations of SAW velocity ($V_S$), SAW coupling factor $k_s^2$ and the first order temperature coefficient of SAW delay with the change in the substrate orientation and the SAW propogation direction. Also shown, where appropriate, is the variation in SAW power-flow angle $\Psi$. The first set of orientations of interest are those shown in FIG. 1. It can be seen that the computed SAW velocity maximises at 3920 ms$^{-1}$ for $\phi = 30°$ while $k_s^2$ decreases from $0.8 \times 10^{-2}$ at $\phi = 0$ to a value of $0.04 \times 10^{-2}$ for $\phi = 45°$. All the orientations in this series show $T_D > 49 \times 10^{-6}$ °C.$^{-1}$. The $k_s^2$ values are higher for the series of orientations represented in FIG. 2, being in all cases greater than $0.65 \times 10^{-2}$. The predicted $T_D$ values vary from $49 \times 10^{-6}$ °C.$^{-1}$ for $\theta = 0$ to $63 \times 10^{-6}$ °C.$^{-1}$ for $\theta = 45°$. Non-zero power-flow angles are observed for all orientations in this set with $0 < \theta < 45°$. FIG. 3 shows the variations in SAW properties which occurs for [110] propagating waves as the substrate plane normal is rotated $\phi$ from [001] to [110]. The SAW velocity increases from 3693 ms$^{-1}$ for $\phi = 0$ to 4152 ms$^{-1}$ for $\phi = 75°$. The $k_s^2$ value, however, decreases from $0.65 \times 10^{-2}$ $\phi = 0$ to $0.016 \times 10^{-2}$ for $\phi = 75°$. The orientation with the most promising predicted properties appears in FIG. 4 with $\theta = 45°$, corresponding to an X-cut, Z-propagating device, this is predicted to possess $V_s = 3510$ ms$^{-1}$, $k_s^2 = 0.82 \times 10^{-2}$ and $T_D = +5 \times 10^{-6}$ °C.$^{-1}$ at 20° C. Theoretical examination of this orientation over a wider temperature range has revealed that its time delay for surface waves is a parabolic function of temperature. It is, therefore, temperature compensated.

SAW delay lines with 48 µm wavelength, an aperture of 2.4 µm, 25 fingers per transducer and a transducer separation of 2.6 mm were deposited on selected substrate orientations of $Li_2B_4O_7$. Substrates were polished with Siton prior to deposition. A standard "float-off" Procedure was used in which a negative photoresist was spun onto the substrates, windows defined in it and an Aluminium (Al) layer evaporated through the windows onto the exposed substrate surface, surplus Al being removed with the photoresist on washing.

Figure 8:
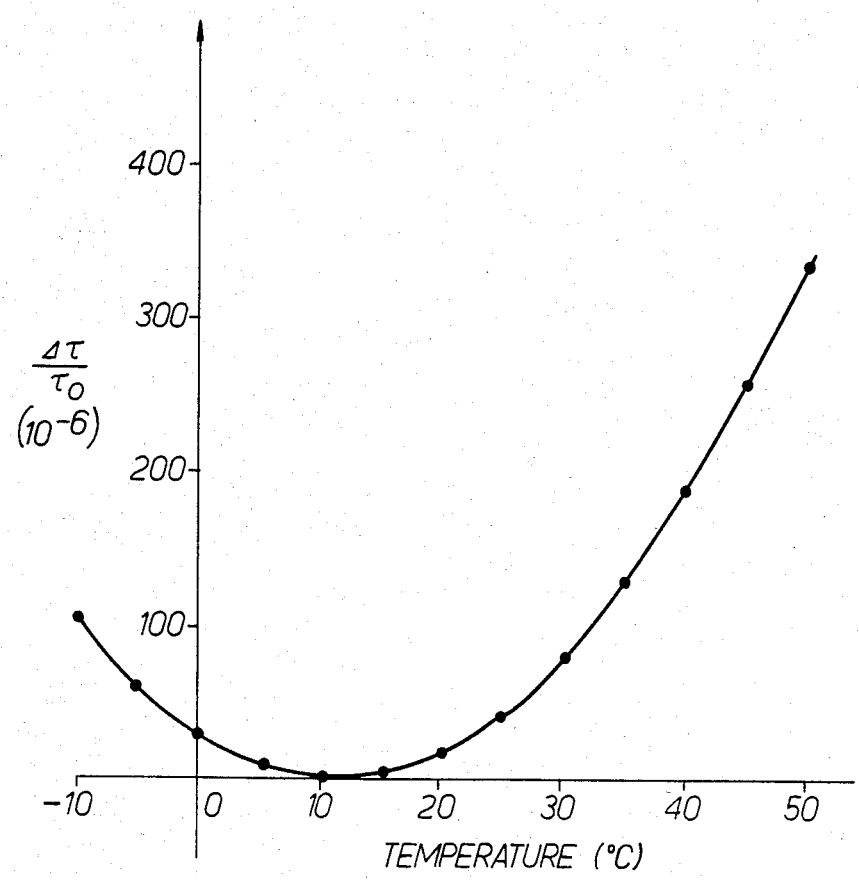

Table 2a gives a comparison between some predicted and observed propagation properties for SAW delay lines fabricated on selected substrate cuts of $Li_2B_4O_7$. It can be seen that there is very good agreement between the observed and predicted properties for all substrates. As noted above, the X-cut, Z-propagating orientation is of particular interest as this is predicted to show a parabolic variation of SAW time delay with temperature. FIG. 8 shows the mean measured variation in the specific time delay ($\Delta\tau/\tau_0$) where $\tau_0$ is the delay at the turn-over temperature) from −10° C. to 50° C. for several delay lines fabricated on the X-cut, Y propagating orientation. Fitting the curves for the individual devices to an equation of the form:

$$\Delta\tau/\tau_o = K_2(T - T_o)^2$$

gave the following mean constants $k_2$ and $T_o$:

$$k_2 = 227(\pm 50) \times 10^{-9} \text{ °C.}^{-2} \quad T_o = 12 \pm 5° \text{ C.}$$

The observed SAW velocity is very similar to that predicted (see Table 2a) while the observed value of $k_s^2$ is about 50% larger than the predicted value. The SAW properties of this orientation of $Li_2B_4O_7$ are compared in Table 2b with those of several other conventional SAW substrate materials. It can be seen that the observed coupling factor of $1.2 \times 10^{-2}$ compares very well with the $k_s^2$ for Y-cut, Z-propagating $LiTaO_3$ and [100]-cut, [011] propagating $Bi_{12}SiO_{20}$. The total variation in delay time from −10° C. to +40° C. for X-cut, Z-propagating $Li_2B_4O_7$ is ±85 ppm, this compares with ±2350 ppm in Y-cut, Z propagating $LiNbO_3$ and ±850 ppm in Y-cut, Z propagating $LiTaO_2$ over the same temperature range. This degree of temperature compensation, combined with the SAW coupling factor of 1.2% makes X-cut, Z propagating $Li_2B_4O_7$ ideal for use in moderately-broad bandwidth SAW filters requiring good thermal stability.

TABLE 2a

PREDICTED AND OBSERVED SAW PROPERTIES OF LITHIUM TETRABORATE

| Orientation Angles in Degrees | | | | Predicted SAW Properties | | | Observed SAW Properties | | |
|---|---|---|---|---|---|---|---|---|---|
| $\theta$ | $\Phi$ | $\alpha$ | Device Orientation | $V_s$ ms$^{-1}$ | $k_s^2$ | $T_D$ $10^{-6}$ °C.$^{-1}$ | $V_s$ ms$^{-1}$ | $k_s^2$ | $T_D$ $10^{-6}$ °C.$^{-1}$ |
| 90 | 6.7 | 90 | 6.7° X-axis Cylinder | 3800 ± 20 | 0.008 ± 0.001 | 46 | 3808 ± 9 | 0.014 | 52 |
| 0 | 0 | 90 | Z-cut, X-Propagating | 3860 ± 20 | 0.008 ± 0.001 | 46 | 3873 ± 21 | 0.009 | 52 |
| 0 | 90 | 90 | X-cut, Z-Propagating | 3510 ± 30 | 0.008 ± 0.001 | Parabolic | 3510 ± 6 | 0.012 | Parabolic |
| 90 | 6.7 | 0 | 6.7° X-axis boule | 3860 ± 20 | 0.007 ± 0.001 | 53 | 3860 ± 30 | 0.014 | 46 |
| 0 | 0 | 45 | Z-cut, [110] Propagating | 3690 ± 30 | 0.007 ± 0.001 | 57 | 3710 ± 30 | 0.011 | 76 |

TABLE 2b
A COMPARISON OF Li$_2$B$_4$O$_7$ WITH OTHER SAW SUBSTRATES

| Substrate Material | Orientation Angles in degrees | | | $V_s$ ms$^{-1}$ | $k_s^2$ ×10$^2$ | $\psi$ (Deg.) | $T_D$ at 19° C. 10$^{-6}$ °C.$^{-1}$ | Substrate Title |
|---|---|---|---|---|---|---|---|---|
| | $\theta$ | $\Phi$ | $\alpha$ | | | | | |
| Quartz | 90 | 47.23 | 10 | 3159.5 | 0.14 | 0 | 0 | ST-cut |
| LiNbO$_3$ | 90 | 90 | 90 | 3491.1 | 4.86 | 0 | +94 | Y-cut, Z-propagating |
| LiTaO$_3$ | 90 | 90 | 90 | 3254 | 1.15 | 0 | +34 | Y-cut, Z-propagating |
| Bi$_{12}$SiO$_{20}$ | 0 | 90 | 45 | 1660 | 1.4 | 0 | +118 | (100)-cut, [011] propagating |
| Li$_2$B$_4$O$_7$ | 0 | 90 | 90 | 3510 | 1.2 | 0 | +5 | X-cut, Z-propagating |

Figure 6:
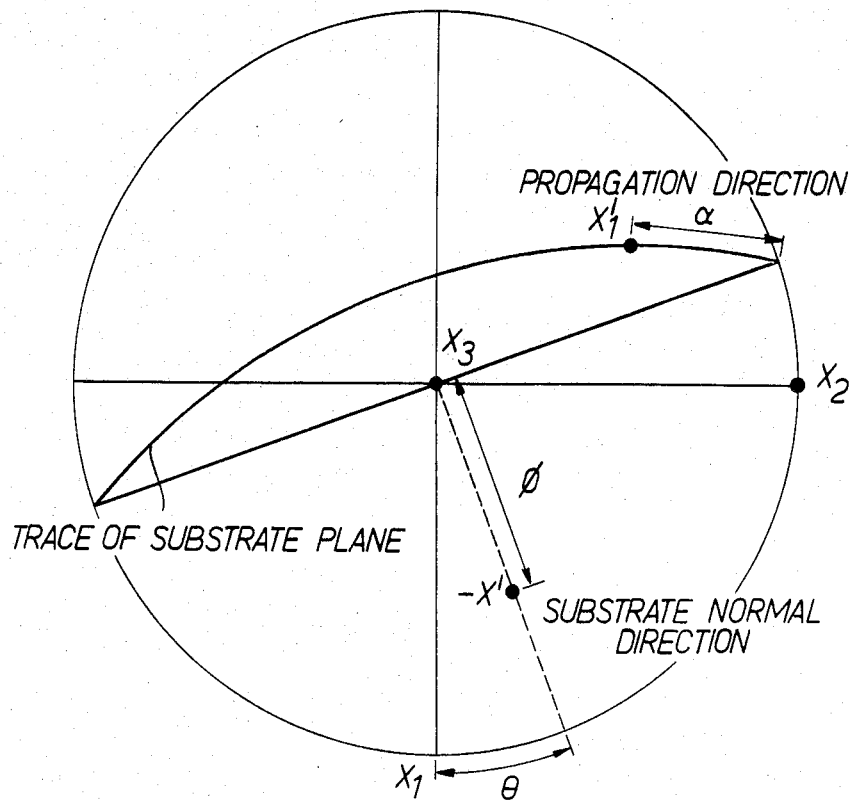
FIG. 6 is a stereogram showing the orientation of the substrate plane normal and the SAW propagation direction defined by angles $\alpha, \theta$ and $\phi$.

For definition of $\alpha$, $\theta$, $\Phi$ - see FIG. 6
$V_s$ = surface wave velocity
$\psi$ = power flow angle
$k_s^2$ = coupling factor (SAW)
$T_D$ = temperature coefficient of delay It is shown from this table that Li$_2$B$_4$O$_7$ has several advantages over many of the other materials commonly-used for SAW devices. Other advantages include the facts that the material possesses a low melting point (950° C.; c.f. 1253° C. in LiNbO$_3$ and 1650° C. in LiTaO$_3$) which facilitates its growth by Czochralski techniques, and that it is a non-ferroelectric piezoelectric, which removes any requirement to pole the material before use.

Specific devices for which the material is suitable include SAW delay lines filters and convolvers for use in radar, communications and domestic video equipment. It may also be used in acousto-optic devices exploiting the interactions between laser beams and a propagating surface wave and acousto-electric devices in which a semiconductor is placed in close proximity to the propagating SAW and the interactions between the electric field associated with the SAW and the charge carriers in the semiconductor are exploited.

Li$_2$B$_4$O$_7$ also has a set of pyroelectric and dielectric properties which make it suitable for use as a pyroelectric infra-red detector/thermal imaging system target material. Table 3 lists the values of its pyroelectric coefficient (p(T)), dielectric constant ($\epsilon$) and dielectric loss (tan $\delta$) measured parallel to the polar axis at room temperature (20° C.). Also listed on this table are the material's volume specific heat (c$^1$) and resistivity parallel to the polar axis ($\rho$), again at 20° C.

A substance's suitability for use in pyroelectric detection systems can be measured in terms of one of its pyroelectric figures-of-merit, which can be defined as follows. The voltage responsivity of a single element detector can be shown to be proportional to:

$F_1 = p(T)/c\epsilon$ (This figure of merit also measures a material's suitability for use as a pyroelectric vidicon target material).

If the noise-sources in a single-element detector are considered, it can be shown that the Johnson Noise is minimised relative to the background temperature noise by chosing a material with the largest possible value of:

$F_2 = p(T)/(c'\epsilon \tan \delta)^{\frac{1}{2}}$

This figure measures material's suitability for use in a single element detector.

Finally, if a pyroelectric material is to be used as a vidicon target it can be used in a conduction pedestal mode only if its electrical time constant, $T_C = \rho.\epsilon.\epsilon.o$ is between 0.04 and 1 sec.

Table 3 lists the values of $F_1$, $F_2$ and $\rho.\epsilon.\epsilon.o$ for Li$_2$B$_4$O$_7$ and, for comparison, also lists the corresponding values for four other pyroelectric single crystals: lithium tantalate (LiTaO$_3$), strontium barium niobate (SBN-Sr$_{0.5}$Ba$_{0.5}$Nb$_2$O$_6$) lead germanate (Pb$_5$Ge$_3$O$_{11}$) and deuterated triglycine sulphate (DTGS). It can be seen that, of these materials, DTGS gives the highest values for $F_1$ and $F_2$, although its electrical resistivity renders it unsuitable for use in a conventional mode pedestal vidicon tube, so that when it is used as a vidicon target other, less convenient, pedestal generation techniques are necessary. Furthermore, DTGS is relatively difficult to use because of its water solubility, low ferroelectric Curie temperature (T$_c$) and chemical instability at elevated temperatures. Of the other, more robust, oxide single crystal materials (LiTaO$_3$, SBN or Pb$_5$Ge$_3$O$_{11}$), LiTaO$_3$ is the one most commonly used for single element detectors because of its high values of $F_1$ and $F_2$. Until recently, this has also looked to be the most promising material for use as an oxide pyroelectric vidicon target, in spite of its high electrical resistivity, and high thermal conductivity which necessitate reticulation of the target (i.e. dividing the target into thermally isolated islands ≈50 μm across by ion-beam etching).

Li$_2$B$_4$O$_7$ possesses properties which give it a value of $F_1$ slightly greater than LiTaO$_3$ coupled with an electrical time constant of only 0.04 sec., making it good for use as a pyroelectric vidicon target which could be used

TABLE 3
THE PYROELECTRIC PROPERTIES OF A NUMBER OF MATERIALS AT 20° C.

Figure 7:
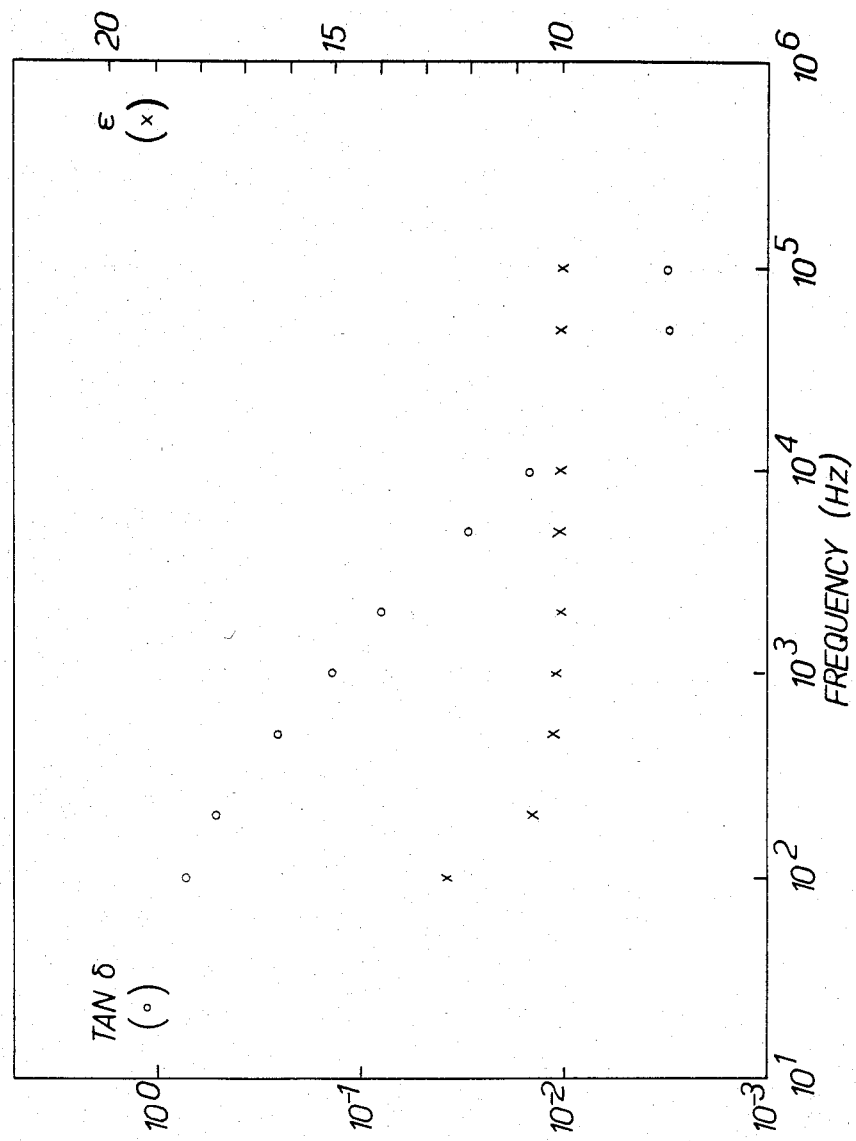
FIG. 7 shows a graph of dielectric loss (tan $\delta$) for lithium tetraborate plotted against frequency which is relevant to the properties of the material for use as a pyroelectric detector and, FIG. 8 shows the mean measured variation in specific time delay with temperature for several SAW delay lines fabricated on x-cut, Z propagating $Li_2B_4O_7$ substrates.

| Material | p(T) 10$^{-8}$ Ccm$^{-2}$K$^{-1}$ | $\epsilon$ at 1592 Hz | tan $\delta$ | $\rho$ $\Omega$cm | c' Jcm$^{-3}$K$^{-1}$ | $F_1 = \frac{p(T)}{c'\epsilon}$ 10$^{-10}$ CcmJ$^{-1}$ | $F_2 = \frac{p(T)}{(c'\epsilon \tan\delta)^{\frac{1}{2}}}$ 10$^{-8}$ | $\rho\epsilon\epsilon_o$ sec. | T$_c$ °C. |
|---|---|---|---|---|---|---|---|---|---|
| DTGS | 3.3 | 25 | 2 × 10$^{-3}$ | >10$^{12}$ | 2.5 | 5.3 | 9.3 | >20 | 60 |
| LiTaO$_3$ | 1.9 | 43 | 1 × 10$^{-3}$ | >10$^{14}$ | 3.2 | 1.38 | 5.1 | >500 | 618 |
| Sr$_{0.5}$Ba$_{0.5}$Nb$_2$O$_6$ | 6.5 | 380 | 3 × 10$^{-3}$ | 10$^{11}$ | 2.1 | 0.81 | 4.2 | 3.36 | 121 |
| Pb$_5$Ge$_3$O$_{11}$ | 1.1 | 45 | 1 × 10$^{-3}$ | 5 × 10$^{11}$ | 2.0 | 1.22 | 3.7 | 1.99 | 178 |
| Li$_2$B$_4$O$_7$ | 0.5 | 10 | 0.03 | 5 × 10$^{10}$ | 3.2 | 1.6 | 0.5 | 0.04 | — | in conduction pedestal mode. The high dielectric loss of $Li_2B_4O_7$ indicates that it is not particularly suitable for use as a single-element detector material at frequencies below 2 KHz However, as shown in FIG. 7 its loss is strongly dependent upon frequency so that at frequencies above 50 KHz where $\tan \delta \simeq 3\times 10^{-3}$, $F_2 = 1.6 \times 10^{-2}$ and therefore at these frequencies, although $F_2$ is still considerably smaller than the value for $LiTaO_3$, the material may be of interest for single element detectors.

$Li_2B_4O_7$ has one other major advantage over the other materials in table 3 in that it is non-ferroelectric. Thus, it does not need to be poled, nor is there any risk of any accidental thermal excursions depoling it, as there is with other more conventional materials. Furthermore, because it possesses no ferroelectric domains, there can be no problems with thermally generated noise caused by domain-wall motion, as would appear to be one problem with $LiTaO_3$.

$Li_2B_4O_7$ therefore is a suitable material for a number of pyroelectric detector applications.

What we claim is:

1. A piezoelectric device which is a surface acoustic wave device in which the active material is lithium tetraborate on X cut Z propogating or an orientation close to X cut or Z propagating.

* * * * *